United States Patent [19]
Isa et al.

[11] Patent Number: 5,677,882
[45] Date of Patent: Oct. 14, 1997

[54] SEMICONDUCTOR MEMORY HAVING REDUNDANCY MEMORY DECODER CIRCUIT

[75] Inventors: Satoshi Isa; Mamoru Fujita, both of Tokyo, Japan

[73] Assignee: NEC Corporation, Tokyo, Japan

[21] Appl. No.: 540,981

[22] Filed: Oct. 11, 1995

[30]  Foreign Application Priority Data

Oct. 12, 1994 [JP] Japan .................. 6-245739

[51] Int. Cl.⁶ .................................................. G11C 7/00
[52] U.S. Cl. ................ 365/200; 365/225.7; 365/230.06
[58] Field of Search ........................... 365/200, 225.7, 365/230.06, 230.08, 189.06, 96

[56]  References Cited

U.S. PATENT DOCUMENTS 4,698,494  10/1987  Chen et al. ........................... 365/200
4,714,839  12/1987  Chung ................................... 365/200
5,381,371   1/1995  Haraguchi ............................. 365/200
5,471,426  11/1995  McClure ............................. 365/225.7
5,517,455   5/1996  McClure et al. .................... 365/225.7

FOREIGN PATENT DOCUMENTS 4-254998  9/1992  Japan .

Primary Examiner—David C. Nelms
Assistant Examiner—Vu A. Le
Attorney, Agent, or Firm—Young & Thompson

[57]  ABSTRACT

A redundancy decoder circuit includes an output line U which takes an active level when an access address supplied thereto is coincident with a redundant address programmed therein. This circuit further includes a fuse F which is blown to deactivate the decoder or not blown to activate the decoder, a latch circuit latching a level responsive to a blown or not-blown state of the fuse, and a transistor controlled by the latch circuit to forcibly hold the output line at an inactive level when the fuse is blown.

5 Claims, 9 Drawing Sheets

FIG. 2A  A1-An 
FIG. 2B  PREB 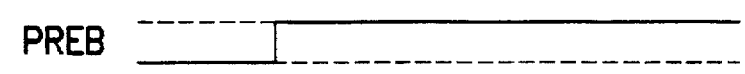
FIG. 2C  EN 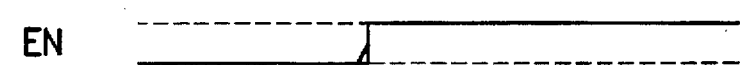
FIG. 2D  U 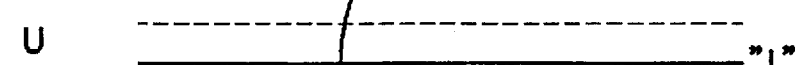
FIG. 2E  R 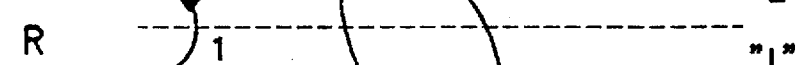
FIG. 2F  ENd 
FIG. 2G  S11 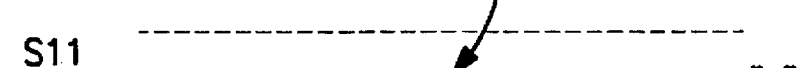
FIG. 4A  A1~An 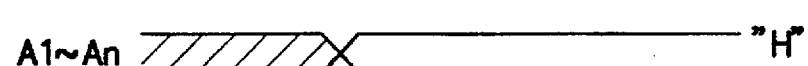
FIG. 4B  PREB 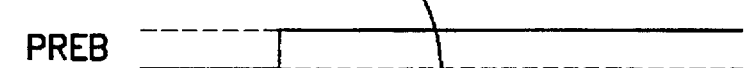
FIG. 4C  EN 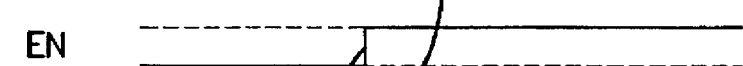
FIG. 4D  U 
FIG. 4E  R 
FIG. 4F  ENd 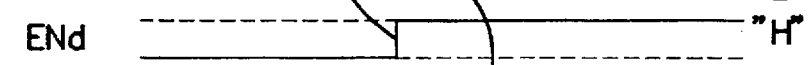
FIG. 4G  S11 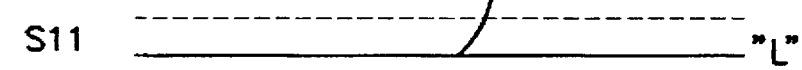

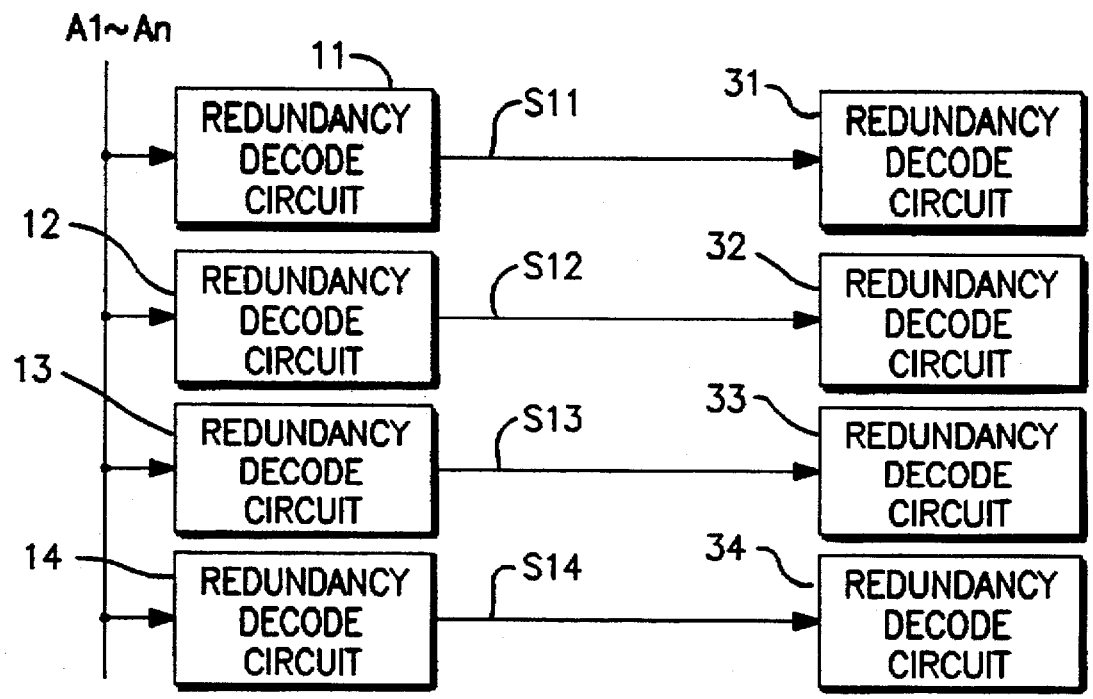
FIG. 5
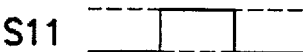
FIG. 6A  S11
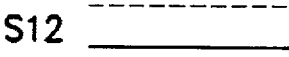
FIG. 6B  S12
FIG. 6C  S13
FIG. 6D  S14
FIG. 6E  S11
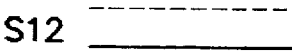
FIG. 6F  S12
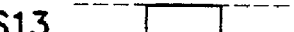
FIG. 6G  S13
FIG. 6H  S14

FIG. 9A PRIOR ART  A1–An
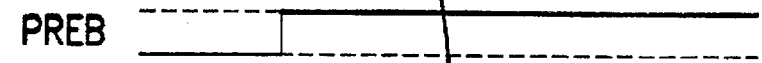
FIG. 9B PRIOR ART  PREB
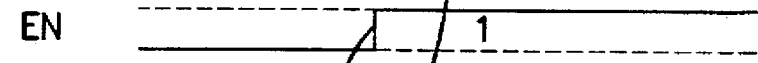
FIG. 9C PRIOR ART  EN
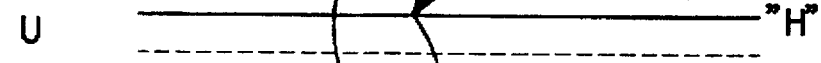
FIG. 9D PRIOR ART  U
FIG. 9E PRIOR ART  ENd
FIG. 9F PRIOR ART  S11
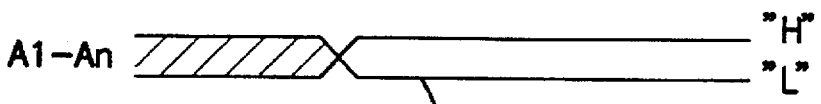
FIG. 9G PRIOR ART  A1–An
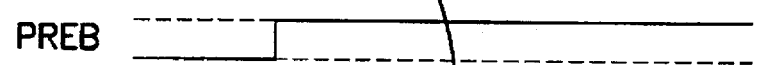
FIG. 9H PRIOR ART  PREB
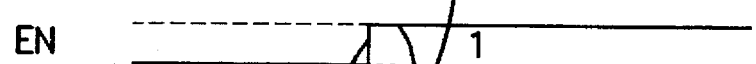
FIG. 9I PRIOR ART  EN
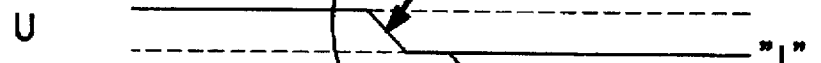
FIG. 9J PRIOR ART  U
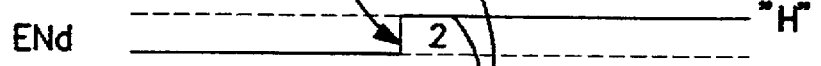
FIG. 9K PRIOR ART  ENd
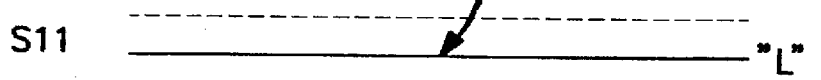
FIG. 9L PRIOR ART  S11

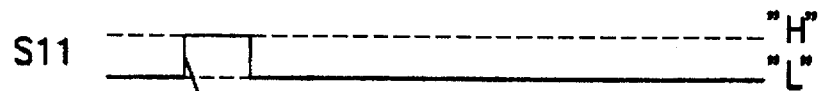
FIG. 10A PRIOR ART S11
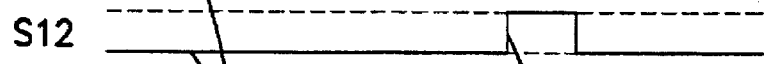
FIG. 10B PRIOR ART S12
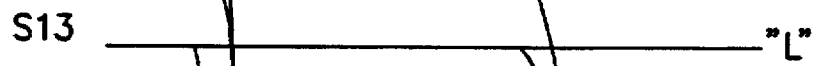
FIG. 10C PRIOR ART S13
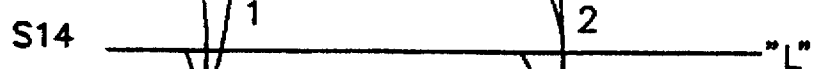
FIG. 10D PRIOR ART S14
FIG. 10E PRIOR ART S21
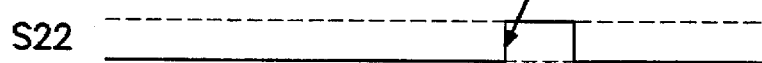
FIG. 10F PRIOR ART S22
FIG. 10G PRIOR ART S23
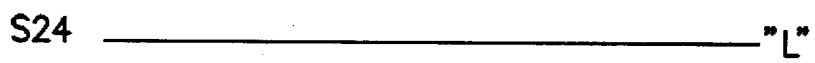
FIG. 10H PRIOR ART S24

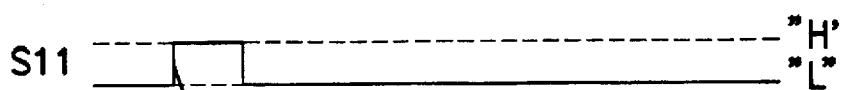
FIG. 10I PRIOR ART S11
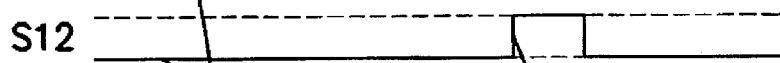
FIG. 10J PRIOR ART S12
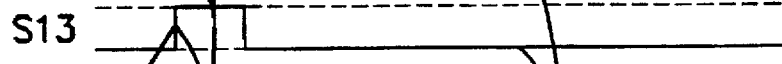
FIG. 10K PRIOR ART S13
FIG. 10L PRIOR ART S14
FIG. 10M PRIOR ART S21
FIG. 10N PRIOR ART S22
FIG. 10O PRIOR ART S23
FIG. 10P PRIOR ART S24

SEMICONDUCTOR MEMORY HAVING REDUNDANCY MEMORY DECODER CIRCUIT

BACKGROUND OF THE INVENTION

1. Field of the Invention

The present invention relates to a semiconductor memory circuit and, more particularly, to a semiconductor memory circuit including a redundant memory cell array circuit which is accessed in stead of a defective one or ones of memory cells of a normal memory cell array.

A redundant memory cell array circuit for replacing a defective memory cell may be set in a memory circuit. This is an effective circuit constitution to prevent the whole memory circuit from being affected due to a defective part of a memory cell.

2. Description of the Related Art

A generally-known memory circuit including the redundant array circuit is disclosed in the official gazette of Japanese Patent Laid-Open Hei 4-254998. The existing memory circuit is described below by referring to FIG. 7.

In FIG. 7, the memory circuit comprises redundant array circuits 31 to 34 used instead of a defective memory cell is present in the cell array (not shown), redundant decode circuits 11 to 14 for transmitting output signals S11 to S14 for selecting a redundant array when the addresses including the address of the defective memory cell can be programmed and inputted addresses A1 to An are the same as the programmed addresses, and a redundant array selection circuit 20 set between the redundant array circuit and the redundant decode circuit.

The redundant array selection circuit 20 comprises invertor circuits IV21 to IV23 for inverting the output signals S12 to S14 outputted from the redundant decode circuits 12 to 14, an AND gate AG21 for computing the logical product between the output signal S11 of the redundant decode circuit 11 and outputs of the invertor circuits IV21 to IV23 and outputs a redundant array selection signal S21 to a redundant array circuit 31, art AND gate AG22 for computing the logical product between the output signal S12 of the redundant decode circuit 12 and outputs of the invertor circuits IV22 and IV23 and outputs a redundant array selection signal S22 to a redundant array circuit 32, and art AND gate AG23 for computing the logical product between the output signal S13 of the redundant decode circuit 13 and an output of the invertor circuit IV23 and outputs a redundant array selection signal S23 to a redundant array circuit 33.

The redundant array selection circuit 20 is constituted so as to output the output signal S14 of the redundant decode circuit 14 directly to the redundant array circuit 34 as a redundant array selection signal S24.

In the above structure, when redundant decode circuits 11 to 14 are programmed with different address values, the corresponding redundant array circuit 31, 32, 33, or 34 is selected in accordance with the output signal S11, S12, S13, or S14 of the redundant decode circuit 11, 12, 13, or 14.

When at least two of the redundant decode circuits 11 to 14 are programmed with the same address value, the redundant array selection circuit 20 is used in order to select only one of the redundant array circuits corresponding to the redundant decode circuits in the arrangement order. That is, when the redundant decode circuits 11 and 12 are programmed with the same address value, the redundant array circuit 32 is selected by the invertor circuit IV21 and the AND gate AG21. Also when all the redundant decode circuits 11 to 14 are programmed with the same address value, the redundant array circuit 34 is selected by the invertor circuits IV21 to IV23 and the AND gates AG21 to AG23.

The internal structure of a redundant decode circuit is described below by referring to the accompanying drawings.

FIG. 8 is a circuit diagram showing an internal structure of the redundant decode circuit 11. In FIG. 8, the redundant decode circuit 11 comprises fuses $F_1$ to $F_n$ to which addresses can be set when the fuses are previously disconnected, a node U to be precharged when transmitting the output signal S11 connected to the fuses $F_1$ to $F_n$ in common, and transistors $N_1$ to $N_n$ which are set correspondingly to the fuses $F_1$ to $F_n$, driven in accordance with N-bit (N is a positive integer; the same applies hereinafter) input addresses A1 to An, and discharge the node U in accordance with the disconnected state of a corresponding fuse.

Moreover, the redundant decode circuit 11 comprises an N-ch transistor N0 which is turned on in response to the input of a redundant decode circuit activation signal (hereinafter referred to as an enable signal) EN to operate N-ch transistors $N_1$ to $N_n$, a delay circuit (DELAY) 1 for delaying the enable signal EN by a predetermined time, an AND circuit AND1 for transmitting the logical level of the node U as the output signal S11 in accordance with a delay output of the delay circuit 1, and a P-ch transistor P0 for precharging the node U in response to the input of a precharge signal PREB. In FIG. 8, symbol VCC represents a power supply voltage and GND represents a ground voltage.

Though other redundant decode circuits 12 to 14 are also constituted similarly to the above redundant decode circuit 11, the circuit 11 is described below for simplification.

In the above structure, when the redundant decode circuit 11 is used, some of the fuses $F_1$ to $F_n$ are previously disconnected so that the output signal S11 is brought into a selective state of "H" when an address value for replacement is inputted and thereby, the address value is programmed.

Operations of the redundant decode circuit 11 are described below by referring to the accompanying drawings. FIGS. 9(*a*) and 9(*b*) are waveform diagrams showing operations of various sections of FIG. 8. In FIGS. 9A–9L, the address signals A1 to An, the precharge signal PREB, the enable signal EN, the level of the node U, a delay output ENd of the delay circuit 1, and the output signal S11 are shown. A shaded portion in FIGS. 9A and 9G represents that it is indeterminate.

First, because the enable signal EN and the precharge signal PREB are both set to "L" level, the transistor P0 is kept on, the transistor NO is kept off, and the node U is precharged to "H" level.

Then, because the precharge signal PREB is set to "H" level, the transistor P0 is turned off and precharge is completed. When the address signals A1 to An are inputted to a redundant decode circuit, the enable signal EN is set to "H" level.

In this case, when an inputted address matches a programmed address, transistors (some of the transistors $N_1$ to $N_n$) connected to some of the fuses $F_1$ to $F_n$, which are not disconnected are set so that all of them are turned off. Therefore, when an inputted address matches a programmed address, the node U is kept at "H" level {(1)} as shown in FIGS. 9A–9F.

In this case, because the signal ENd generated when the enable signal EN is delayed by the delay circuit 1 is kept at "H" level, the output signal S11 which is the logical product between the level of the node U and the signal ENd is set to the selective state of "H" level {(2)} by the AND circuit AND1.

However, when an inputted address does not match a programmed address, at least one of the transistors (some of the transistors $N_1$ to $N_n$) connected to some of the fuses $F_1$ to $F_n$, which are not disconnected is turned on and the transistor N0 is also turned on. Therefore, when an inputted address does not match a programmed address, the node U is set to "L" level {(1)} because precharged electric charges are extracted.

Thereby, even if the signal ENd generated when the enable signal EN is delayed by the delay circuit 1 is kept at "H" level, the output signal S11 which is the logical product between the level of the node U and the signal End is set to the non-selective state of "L" level by the AND circuit AND1 {(2)}.

To describe operations of the redundant array circuit 20, it is assumed that the redundant array circuits 31 and 32 are alternately operated but the redundant array circuits 33 and 34 are not operated.

Operations when addresses programmed in the redundant decode circuits 11 and 12 are different are described below by referring to the waveform diagrams in FIGS. 10A–10H. In FIGS. 10(a) and 10(b), the output signals S11 to S14 of the redundant decode circuits 11 to 14 and the redundant array selection signals S21 to S24 for the redundant array circuits 21 to 24 are shown.

In FIG. 10A, when an address programmed in the redundant decode circuit 11 is inputted, the output signal S11 is set to "H" and other output signals S12 to S14 are set to "L" because only the redundant decode circuit 11 is brought into a selective state. Therefore, only the redundant array selection signal. S21 which is an output of the AND gate AG21 is set to "H" and the redundant array selection signals S22 to S24 which are outputs of the other AND gates AG22 to AG24 are set to "L" {(1)}. Thereby, the redundant array circuit 31 is selected.

Similarly, when an address programmed in the redundant decode circuit 12 is inputted, the redundant array circuit 32 is selected because only the redundant array selection signal S22 is set to "H" {(2)}.

Then, a case in which a defective memory cell is present in the redundant array 31 is described below by referring to the waveform diagrams in FIGS. 10I–10P.

In this case, the same address as a value programmed in the redundant decode circuit 11 is programmed in the redundant decode circuit 13. If addresses programmed in the redundant decode circuits 11 and 13 are inputted, he output signals S11 and S13 are set to "H" because the redundant decode circuits 11 and 13 are brought into a selective state.

However, because an inverted signal of the output signal S13 is inputted to the AND gate AG21, the redundant array selection signal S21 which is an output of the gate AG21 is set to "L" {(1)}. However, because the output signal S13 is directly inputted to the AND gate AG23, the redundant array selection signal S23 which is an output of the gate AG23 is set to "H" {(2)}. Therefore, the redundant array circuit 33 is selected instead of he redundant array circuit 31.

However, when an address programmed in the redundant decode circuit 12 is inputted, the redundant array circuit 32 is selected because only the redundant array selection signal S22 is set to "H" {(3)}.

As the storage capacity of a semiconductor memory increases, the capacity of a redundant memory cell for replacing a defective memory cell in a normal memory cell array increased. Therefore, the probability of using a redundant array circuit selected by a redundant decode circuit is also increasing.

If a defective memory cell is present in a redundant array circuit at the replacement destination, it is necessary to replace the redundant array circuit with another redundant array circuit by using a new redundant decode circuit. In this case, the above-described existing memory circuit has the problems that the area of a redundant array selection circuit increases and a chip area increases because the number of redundant decode circuits increases and thereby, the number of wires in a redundant array selection circuit, the number of invertor circuits, and the number of AND gates for generating a select signal for selecting redundant array circuit.

Moreover, the above existing memory circuit has the problems that the time for performing logical operations in a redundant array selection circuit to select a redundant array circuit is necessary and thereby, the operation speed lowers.

SUMMARY OF THE INVENTION

An object of the present invention is to provide a memory circuit with a redundancy array circuit capable of preventing a chip area from increasing and the operation speed from lowering.

According to a first aspect of the present invention, there is provided a redundancy decoder circuit which includes an output line, a precharge circuit for precharging the output line in response to a precharge signal, a plurality of first transistors provided correspondingly to a plurality of address signals and coupled between the output line and a first power line, a fuse provided controllably to be blown or not, a latch circuit coupled to the fuse to produce a control signal which takes a first logic level when the fuse is blown and a second logic level when the fuse is not blown, and a second transistor coupled between the output line and the first power line and controlled by the control signal. As a result, the second transistor controlled by the latch circuit to forcibly hold the output line at an inactive level when the fuse is blown.

In a second aspect of the present invention, there is provided a redundancy decoder circuit which includes an output line, a precharge circuit for precharging the output line in response to a precharge signal, a plurality of first transistors provided correspondingly to a plurality of address signals and coupled between the output line and a common node, means for coupling the common node to a first power line, a fuse provided controllably to be blown or not, a latch circuit connected to the fuse to output a control signal which takes a first logic level when the fuse is blown and a second logic level when the fuse is not blown, and a first gate circuit receiving a level of the output line and the control signal and producing an output signal which is responsive to the level of the output line when the control signal takes the second logic level and is fixed to a predetermined level when the control signal takes the first logic level. As a result, the first gate controlled by the control signal from the latch circuit to forcibly hold the output line at an inactive level when the fuse is blown.

BRIEF DESCRIPTION OF THE DRAWINGS

The above and other objects, advantages and features of the present invention will be more apparent from the following description taken in conjunction with the accompanying drawings, in which

FIGS. 2A–2G are waveform diagrams showing the operation of each section when the redundant decode circuit is set to the invalid state;

FIGS. 4A–4G are waveform diagrams showing the operation of each section when the redundant decode circuit in FIG. 3 is set to the invalid state;

FIG. 5 is a block diagram showing of a main section of the memory circuit of first and second embodiments of the present invention;

FIGS. 6A–6D show are waveform diagrams showing the operations of sections of the memory circuit in FIG. 5, in which FIGS. 6A–6H show the operation when addresses programmed in two redundant decode circuits are different from each other and FIGS. 6E–6H show the operation when a defective memory cell is present in a redundant array circuit;

FIGS. 9A–9L are waveform diagrams showing the operations of sections of the redundant decode circuit in FIG. 8, in which FIGS. 9A–9F show the operation when an address programmed in a redundant decode circuit matches an inputted address and FIGS. 9G–9L show the operation when the former address does not match the latter address; and FIGS. 10A–10P are waveform diagrams showing the operations of sections of the redundant decode circuit in FIG. 8, in which FIGS. 10A–10H show the operation when addresses programmed in two redundant decode circuits are different from each other and FIGS. 10G–10P show the operation when a defective memory cell is present in a redundant array circuit.

DETAILED DESCRIPTION OF THE PREFERRED EMBODIMENTS

Figure 1:
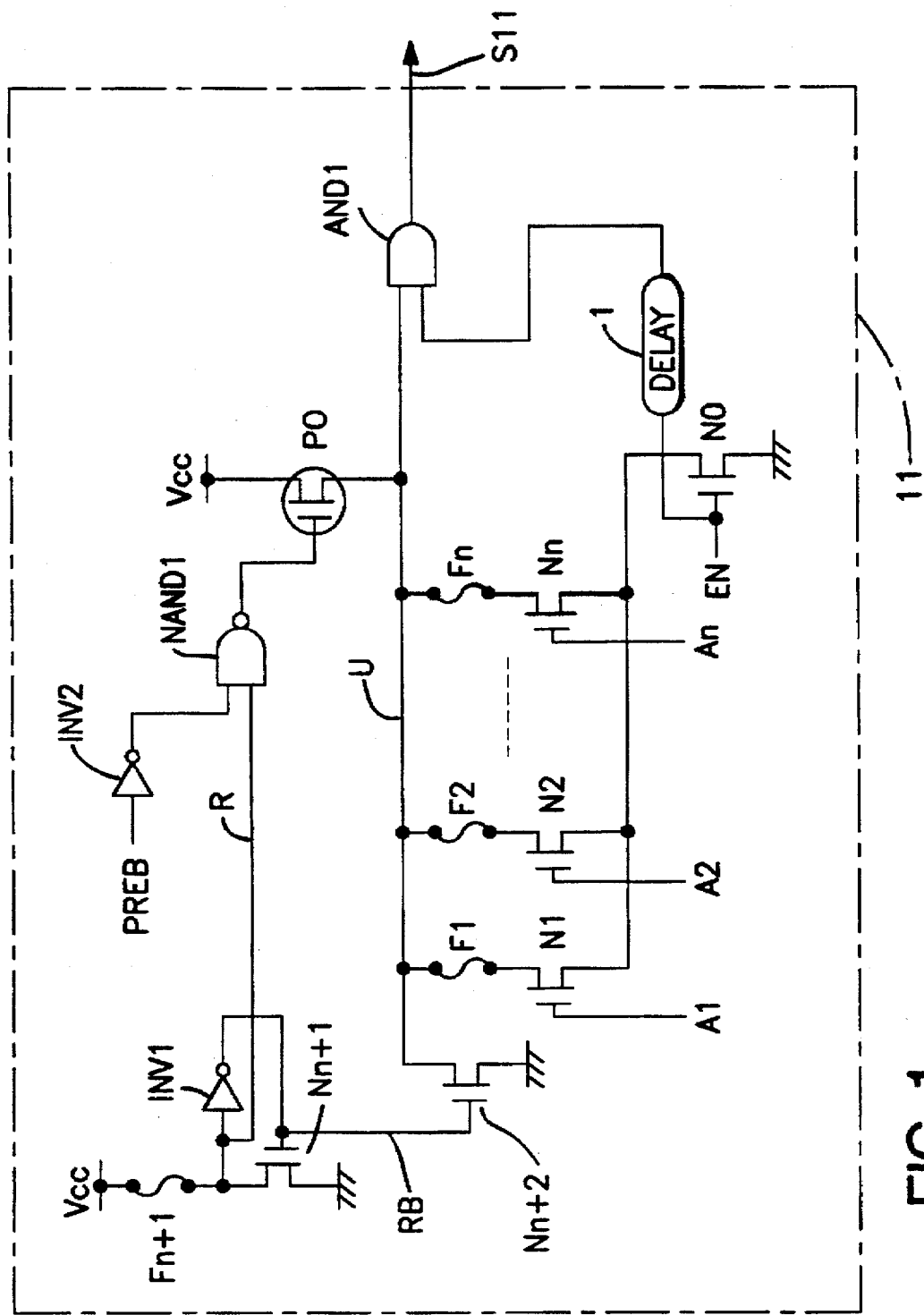
FIG. 1 is a circuit diagram showing of a redundant decode circuit in the memory circuit according to first embodiment of the present invention.
Figure 8:
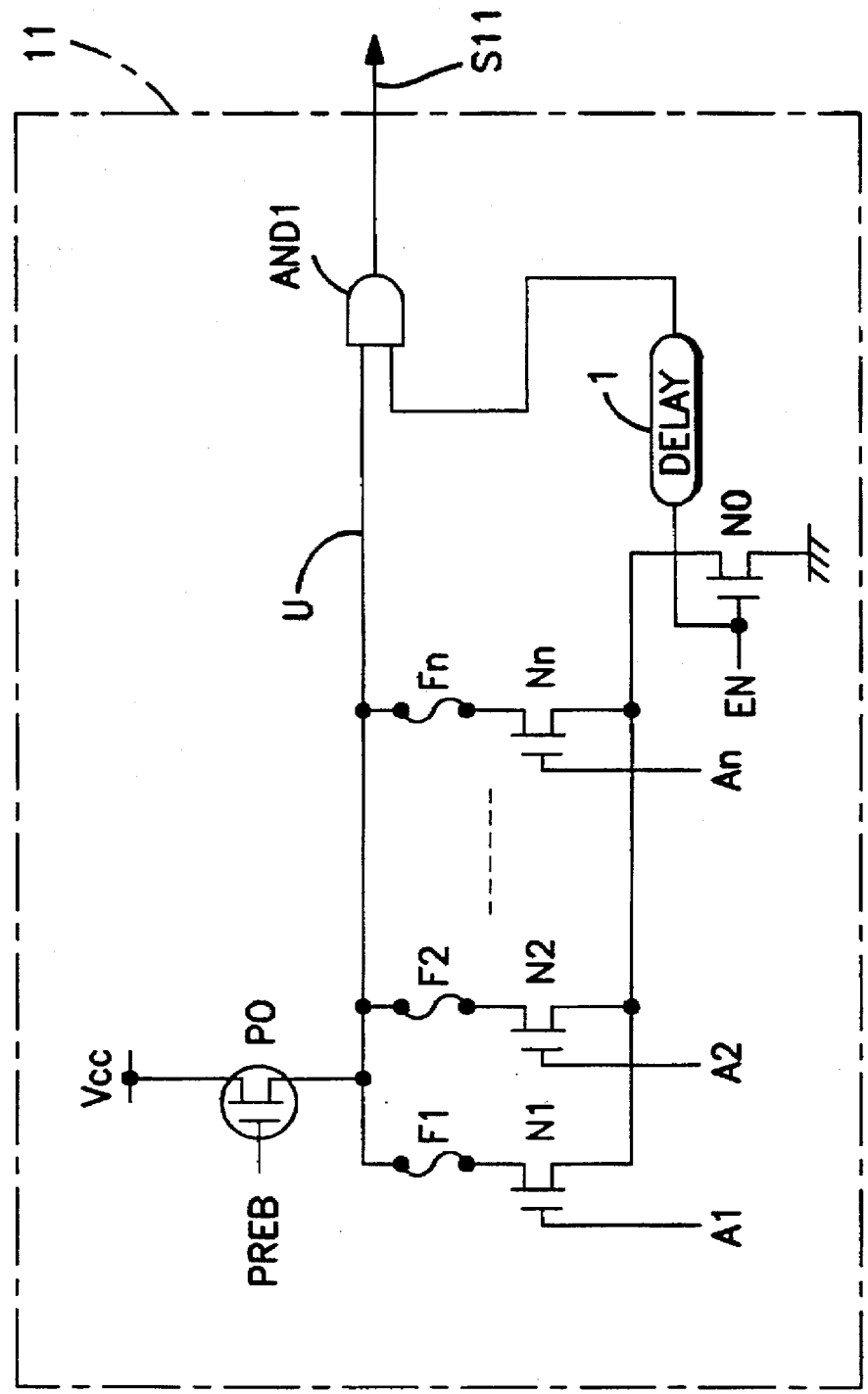
FIG. 8 is a circuit diagram showing the structure of a redundant decode circuit in an existing memory circuit.

Referring now to FIG. 1, there is shown a redundant decoder circuit according to a first embodiment of the present invention, in which the same potions as those in FIG. 8 are denoted by the same symbols. In this redundant decoder circuit a fuse $F_{n+1}$ for setting a redundant decode circuit to the valid state or the invalid state, N-ch transistors $N_{n+1}$ and $N_{n+2}$, invertor INV1 and INV2, and a NAND gate NAND1 are added.

The N-ch transistor $N_{n+1}$ and the invertor INV1 constitute a flip flop to be set or reset in accordance with the connected or disconnected state of the fuse $F_{n+1}$. That is, the connected or disconnected state of the fuse $F_{n+1}$ is held by the flip flop.

Also in the case of this embodiment, an address value uses an N-bit binary number and it is programmed by connection or disconnection of the fuses $F_1$ to $F_n$ each of which is set to each bit of the binary number.

In the above structure, the valid or invalid state of the redundant decode circuit is set by the fuse $F_{n+1}$ in the redundant decode circuit. When the fuse $F_{n+1}$ is connected (not disconnected), the redundant decode circuit is brought into the valid state, that is, the enable state. However, when the fuse $F_{n+1}$ is disconnected, the redundant decode circuit is brought into the invalid state, that is, the disable state.

The fuse $F_{n+1}$ is normally connected, a node R is kept at "H", a node RB is kept at "L", and the redundant decode circuit is brought into the valid state.

Operations of the redundant decode circuit under the valid state are described below.

First, the N-ch transistor $N_{n+2}$ is turned off because "L" of the node RB is inputted to the gate terminal of the transistor. In this case, because "H" of the node R is inputted to one input terminal of the NAND gate NAND1, a level corresponding to the precharge signal PREB is inputted to the P-ch transistor P0. Therefore, the redundant decode circuit performs the same operations as those in FIGS. 9(a) and 9(b) previously described. That is, in this case, the redundant decode circuit is under the valid state.

When the fuse $F_{n+1}$ is disconnected, the node R is kept at "L" and the node RB is kept at "H" by the flip flop, and the redundant decode circuit is brought into the invalid state. Operations of the redundant decode circuit under the invalid state are described below by referring to FIG. 2. In FIG. 2, the same signal as that in FIG. 9 is provided with the same symbol.

In FIGS. 2A–2G, because "L" of the node R is inputted to one input terminal of the NAND gate NAND1, the P-ch transistor P0 is normally turned off independently of the level of the precharge signal PREB. Therefore, the precharge circuit is not performed but the discharge state is set {(1)}. Moreover, the N-ch transistor $N_{n+2}$ is turned on because "H" of the node RB is inputted to the gate terminal of the transistor. Therefore, the node U is normally set to "L" and the redundant array selection signal S11 is fixed to the non-selective state "L" {(2)}. That is, in this case, the redundant decode circuit is brought into the invalid state.

Figure 3:
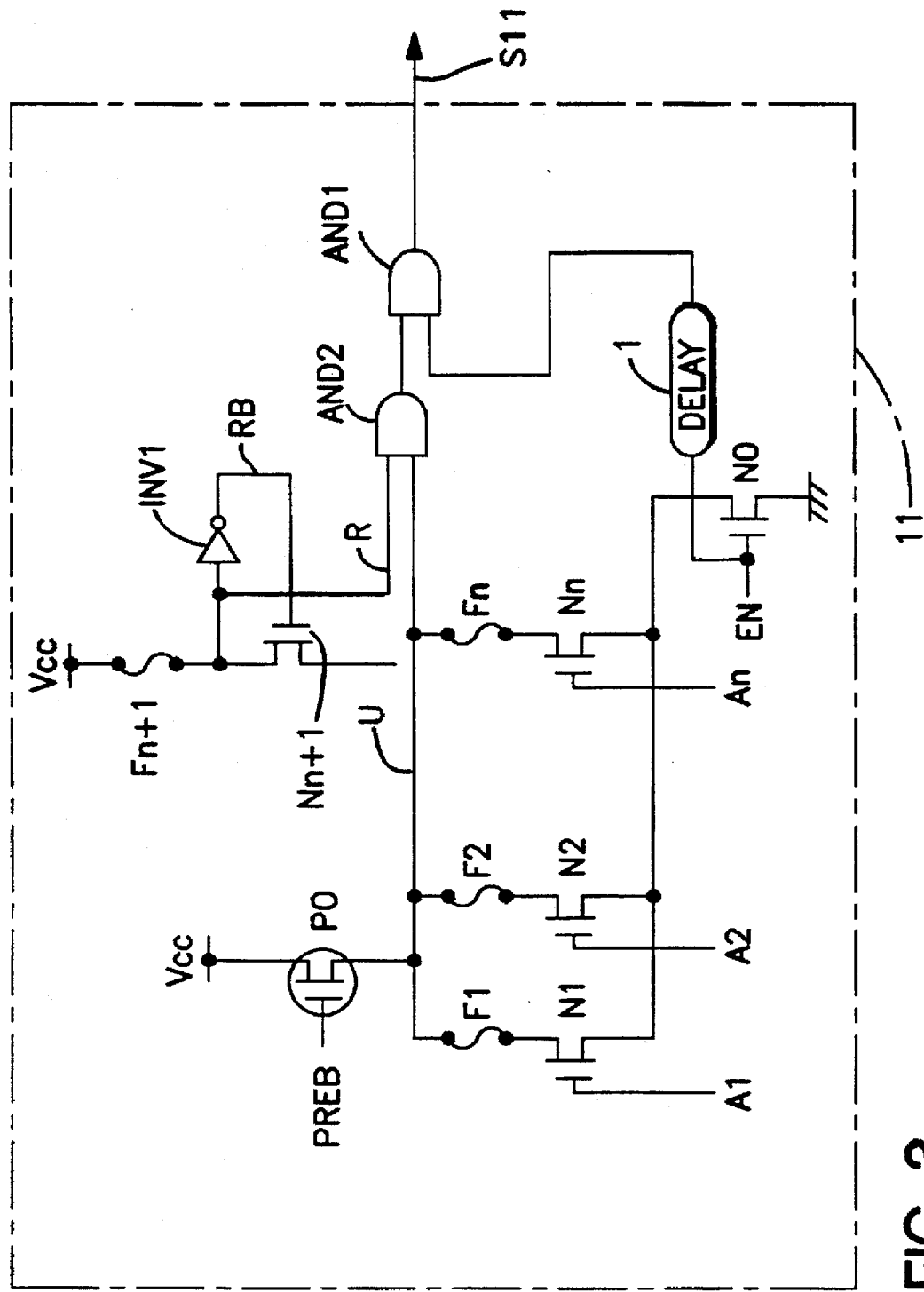
FIG. 3 is a circuit diagram showing of the redundant decode circuit in the memory circuit according to a second embodiment of the present invention.

FIG. 3 is a circuit diagram showing the structure of a redundant decode circuit in the memory circuit of the second embodiment of the present invention, in which the same portion as that in FIG. 8 is provided with the same symbol. The structure of this embodiment is the same as that of the first embodiment in that the valid or invalid state of the redundant decode circuit is set by connecting or disconnecting the fuse $F_{n+1}$ in the redundant decode circuit. Moreover, the structure of this embodiment is the same as that of the first embodiment in that the connected or disconnected state of the fuse $F_{n+1}$ is kept by the flip flop comprising he N-ch transistor $N_{n+1}$ and the invertor INV1.

This embodiment is different from the first embodiment in that an AND circuit AND2 is set between the node U and the AND circuit AND1 and the connected or disconnected state of the fuse $F_{n+1}$ held by the flip flop comprising the N-ch transistor $N_{n+1}$ and the invertor INV1 is inputted to one input terminal of the AND circuit AND2.

Because the P-ch transistor P0 and the N-ch transistors $N_1$ to $N_n$ perform the same operations as described above, the level charge of the node U is also the same. The redundant decode circuit is set to the valid or invalid state by the logical product between the nodes U and R.

Similarly to the case of the first embodiment, because the node R is kept at "H", an output of the AND circuit AND2 is set to a level corresponding to the level of the node U. That is, in this case, the redundant array selection signals S11 to S14 is also set to a level corresponding to the level of the node U. Therefore, the redundant decode circuit is brought into the valid state.

Then, operations of the redundant decode circuit when the fuse $F_{n+1}$ is disconnected are described below by referring to FIG. 4. In FIGS. 4A–4G the same signal as that in FIGS. 9A–9L is provided with the same symbol.

Similarly to the case of the first embodiment, because the node R is normally kept at "L", "L" of the node R is inputted to one input terminal of the AND circuit AND2. Therefore, the level of the node U changes in accordance with mismatching {(1)} or matching {(2)} of a set address by fuse F1-Fn and an inputted address. However, because the output "L" of the AND circuit AND2 is inputted to one input terminal of the AND circuit AND1, the redundant array selection signal S11 is normally kept at the non-selective state "L" independently of the level of the node U {(3)}. That is, in this case, the redundant decode circuit is brought into the invalid state.

Figure 7:
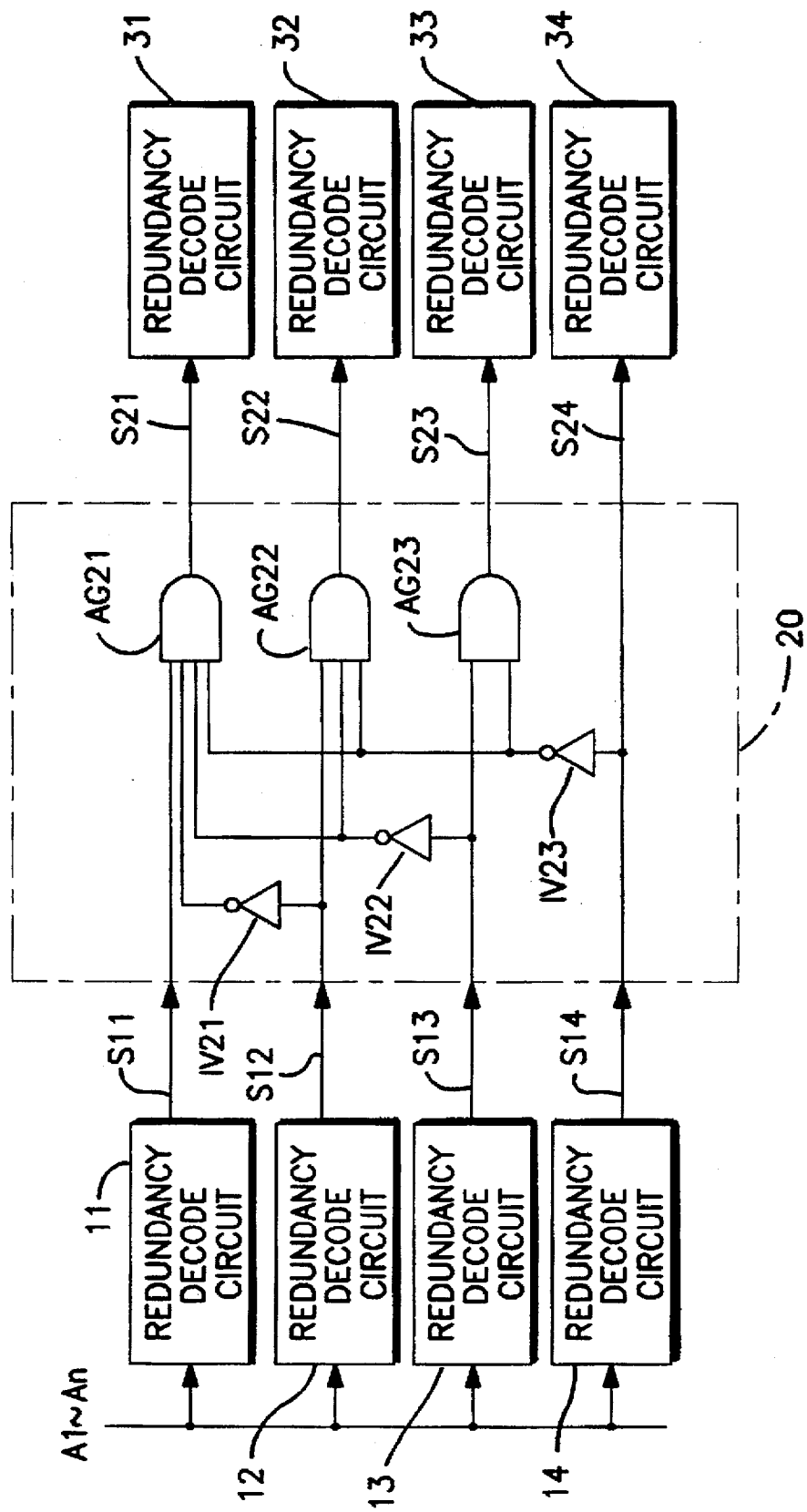
FIG. 7 is a block diagram showing the structure of the main section of an existing memory circuit.

By using the redundant decode circuit 11 of the first or second embodiment described above, it is possible to constitute a memory circuit as shown in FIG. 5. In FIG. 5, it is assumed that other redundant decode circuits 12 to 14 are also similarly constituted, and the same portion as that in FIG. 7 is provided with the same symbol. According to this structure, four redundant decode circuits 11 to 14 correspond to the redundant array circuits 31 to 34 one to one and a redundant array selection circuit required by the existing memory circuit (FIG. 7) is unnecessary. Even if four or more redundant array circuits are used, it is enough to use redundant decode circuits equal to the number of the redundant array circuits and no redundant array selection circuit is necessary.

In this case, for comparison with the existing memory circuit, it is assumed that the redundant array circuits 31 and 32 are alternately operated and the redundant circuits 33 and 34 are not operated. The case in which the addresses programmed in the redundant decode circuits 11 and 12 are different from each other is described below by referring to FIGS. 6A-6D. In FIGS. 6A-6H, the same signal as that in FIGS. 10A-10P is provided with the same symbol.

If the same address as that programmed in the redundant decode circuit 11 is inputted, only the redundant decode circuit 11 is brought into the selective state. Therefore, the redundant array selection signal S11 is set to "H" and other redundant array selection signals S12 and S13 are set to "L" and thereby, he redundant array circuit 31 is selected. Similarly, when the same address as that programmed in the redundant decode circuit 12 is inputted, the redundant array circuit 32 is selected because only the redundant array selection signal S12 is set to "H". This is the same as the operation in FIG. 10(a) previously described.

Then, the case in which a defective memory cell is present in the redundant array circuit 31 is described below by referring to FIGS. 6E-6H.

In this case, the same address as that programmed in the redundant decode circuit 11 is programmed in the redundant decode circuit 13. Then, the fuse $F_{n+1}$ in the redundant decode circuit 11 is disconnected. If the addresses programmed in the redundant decode circuits 11 and 13 are inputted, the redundant array selection signal S11 in the redundant decode circuit 11 is fixed to the non-selective state "L". However, because the redundant decode circuit 13 is brought into the selective state, the redundant array selection signal S13 is set to "H" and the redundant array circuit 33 is selected instead of the redundant array circuit 31.

In this case, the redundant array selection signals S11 and S13 are both set to the selective state "H" in FIGS. 10I-10P as previously described. In the case of the present invention, however, only the redundant array selection signal S13 is brought into the selective state "H"

As described above, when a defective memory cell is present in a redundant array circuit, the present invention makes it possible to simply set a redundant decode circuit to the invalid state only by disconnecting a fuse in the redundant decode circuit. Therefore, it is possible to repeatedly replace unused redundant decode circuits with other redundant array circuits and thereby, the yield of a memory circuit is improved.

Moreover, because a redundant array selection circuit required by the existing memory circuit (FIG. 7) is unnecessary, it is possible to decrease a chip area up to a value equivalent to the area of a redundant array circuit. Furthermore, because the redundant array selection circuit is unnecessary, it is possible to omit the time for selecting a redundant array circuit through logical operations and improve the operation speed of a memory circuit.

What is claimed is:

1. A semiconductor memory having a redundancy decoder circuit, said decoder circuit comprising:

an output line;

a precharge circuit for precharging said output line in response to a precharge signal;

a plurality of first transistors provided correspondingly to a plurality of address signals and coupled between said output line and a first power line;

a fuse provided controllably to be blown or not;

a latch circuit coupled to said fuse to produce a control signal which takes a first logic level when said fuse is blown and a second logic level when said fuse is not blown; and a second transistor coupled between said output line and said first power line and controlled by said control signal, wherein said fuse is connected between a second power line and a first node and said latch circuit includes a third transistor connected between said first power line and said first node and an invertor having an input node connected to said first node and an output node connected to gates of said second and third transistors, and wherein said precharge circuit includes a fourth transistor coupled between said output line and said second power line and a gate circuit allowing said fourth transistor to respond to said precharge signal when said fuse is not blown and rendering said fourth transistor non-connective when said fuse is blown.

2. A semiconductor memory having a redundancy decoder circuit, said decoder circuit comprising:

an output line;

a precharge circuit for precharging said output line in response to a precharge signal;

a plurality of first transistors provided correspondingly to a plurality of address signals and coupled between said output line and a common node;

means for coupling said common node to a first power line;

a fuse provided controllably to be blown or not;

a latch circuit connected to said fuse to output a control signal which takes a first logic level when said fuse is blown and a second logic level when said fuse is not blown; and a first gate circuit receiving a level of said output line and said control signal and producing an output signal which is responsive to said level of said output line when said control signal takes said second logic level and is fixed to a predetermined level when said control signal takes said first logic level.

3. The memory as claimed in claim 2, wherein said fuse is connected between a second power line and a first node and said latch circuit includes a second transistor connected between said first power supply line and said first node and an invertor having an input node connected to said first node and an output node connected to a gate of said second transistor.

4. The memory as claimed in claim 3, wherein said means comprises a third transistor coupled between said common node and said first power line and rendered conductive in response to an enable-signal.

5. The memory as claimed in claim 4, further comprising a delay circuit for delaying said enable-signal to produce a delayed enable-signal, and a second gate circuit rendered open by said delay enable-signal to transfer said output signal of said first gate circuit.

* * * * *